(12) United States Patent
Endo et al.

(10) Patent No.: US 6,259,640 B1
(45) Date of Patent: Jul. 10, 2001

(54) SEMICONDUCTOR STORAGE DEVICE HAVING A DELAYED SENSE AMPLIFIER ACTIVATING SIGNAL DURING A TEST MODE

(75) Inventors: Shunsuke Endo; Takashi Itou, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/694,485

(22) Filed: Oct. 24, 2000

(30) Foreign Application Priority Data

Jan. 17, 2000 (JP) .................................................. 12-00764

(51) Int. Cl.[7] .................................................. G11C 29/00
(52) U.S. Cl. .......................... 365/201; 365/190; 365/193; 365/194; 365/196
(58) Field of Search .................... 365/201, 190, 365/205, 194, 193, 196

(56) References Cited

U.S. PATENT DOCUMENTS 5,973,981 * 10/1999 Lee .................................. 365/230.01
6,163,862 * 12/2000 Adams et al. ........................ 714/718

FOREIGN PATENT DOCUMENTS 4-28084  1/1992  (JP) .............................. G11C/11/401

* cited by examiner

*Primary Examiner*—Andrew Q. Tran
(74) *Attorney, Agent, or Firm*—McDermott, Will & Emery

(57) ABSTRACT

A semiconductor storage device capable of detecting a high resistance shortcircuit between a storage node of a memory cell and a gate in a transistor of the memory cell. A sense amplifier activating signal generating circuit section 13 in a ROW control section 2 delays, by a predetermined time, a timing for activating sense amplifier activating signals SON and ZSOP in a test mode in which a High-level test mode signal TM is input, delays, by a predetermined time, a timing for activating each of the sense amplifiers of the sense amplifier section 3, and detects a high resistance shortcircuit caused between a storage node SN in the memory cell and a gate TG of the transistor.

8 Claims, 9 Drawing Sheets

SEMICONDUCTOR STORAGE DEVICE HAVING A DELAYED SENSE AMPLIFIER ACTIVATING SIGNAL DURING A TEST MODE

BACKGROUND OF THE INVENTION

1. Field of the Invention

The present invention relates to a semiconductor storage device including a detecting circuit capable of detecting a shortcircuit between a storage node in a memory cell and a transistor gate, in particular, a high resistance shortcircuit therebetween.

2. Description of the Related Art

In a semiconductor storage device using a DRAM shown in FIG. 12, for example, when a voltage is applied to a gate TG of a transistor 101 in a memory cell 100, the transistor 101 is turned ON and electric charges stored in a capacity 102 are fed to a bit line BL through a storage node SN, accompanied by change of the electric potential of the bit line BL. A sense amplifier (not shown) serves to recognize the electric potential and to output the electric potential as magnitude data.

In the process of manufacturing the memory cell for the semiconductor storage device, a shortcircuit has been caused between the gate TG of the transistor 101 constituting the memory cell 100 or between the gate TG and the storage node SN due to an etching residue or a foreign substance in some cases. The memory cell is not operated well due to the shortcircuit. In order to eliminate this drawback, it has been necessary to detect the shortcircuited memory cell. For example, in the case in which the storage node SN and the gate TG of the transistor 101 are shortcircuited due to a substance having a low resistance, the shortcircuit can easily be detected because the electric potential of the gate TG is transmitted to the storage node SN, resulting in inversion of the electric potential level at the storage node SN.

However, in the case of a high resistance shortcircuit caused by a foreign substance having a high resistance, it has conventionally been difficult to detect the high resistance shortcircuit. In the following description, the "high resistance shortcircuit" implies a shortcircuit caused by a foreign substance having a high resistance which takes a time in transmitting a High-level electric potential at the gate TG of the transistor 101 to the storage node SN to such an extent that the Low-level electric potential at the storage node SN cannot be inverted to the High-level through the High-level electric potential at the gate TG during the operating timing of the conventional sense amplifier.

In the event that the gate TG of the transistor 101 and the storage node SN are shortcircuited with a high resistance due to the contact with the foreign substance, the data reading and sensing operation is completed before the High-level electric potential at the gate TG is transmitted to the storage node SN and inverted during the operation for reading data from the memory cell due to the high resistance shortcircuit during the operation of the conventional sense amplifier when a voltage is applied to the gate TG of the transistor 101 to turn the transistor 101 on and to read the electric potential level at the storage node SN. For this reason, data errors do not occur and the high resistance shortcircuit between the storage node SN and the gate TG cannot therefore be detected.

However, such a high resistance shortcircuit needs to be detected due to the unstable operation of the memory cell. In the conventional art, there have not been methods other than a physical analyzing method such as structural analysis and it has been difficult to detect the high resistance shortcircuit electrically on a circuit bases.

Japanese Patent Laid-Open Publication No. 4-28084 discloses a semiconductor storage device in which the start timing of the operation for detecting a potential difference between a pair of bit lines can be set externally to allow information about a bit line having a small potential difference to be correctly distinguished due to the insufficient capacity of the capacitor of the memory cell and the like so that a device including the bit line can be utilized as a good product. On the other hand, the present invention has an object to detect a high resistance shortcircuit between the gate of the transistor in the memory cell and the storage node, in which the operation timing of the sense amplifier in a test mode or the like is delayed for a predetermined period such that the high resistance shortcircuit can be detected. Thus, the present invention is different from the Japanese Patent Laid-Open Publication No. 4-28084.

Japanese Patent Laid-Open Publication No. 7-85668 discloses a semiconductor storage device which is intended for reducing noises during the operation of a sense amplifier by providing a capacity between an activating control circuit and the sense amplifier to prevent a rapid change in the power source of the sense amplifier. Similarly, Japanese Patent Laid-Open Publication No. 5-144263 discloses a semiconductor storage device in which a plurality of delay circuits constituted by using a resistance and a capacity are provided in a sub-block unit dividing a bit line, the operation timing of the sense amplifiers between banks is shifted and the number of the sense amplifiers operating is simultaneously decreased by utilizing the fact that a time is varied for transmitting a change in the electric potential of the bit line caused by the electric potential of the cell to the sense amplifier according to a distance between word lines selected by the sense amplifier during multi-bank operation so that an instantaneous operating current and noises made during the operation can be reduced, respectively.

Moreover, Japanese Patent Laid-Open Publication No. 62-202398 discloses a semiconductor storage device in which a circuit for detecting that a word line is boosted to have the threshold of a transfer gate of a cell and a sense amplifier is operated in a timing in which the word line is boosted reliably to minimize the delay of a boost time for the word line, thereby increasing a speed.

SUMMARY OF THE INVENTION

The present invention has been made to solve the above-mentioned problems and has an object to provide a semiconductor storage device capable of detecting a high resistance shortcircuit between the storage node of a memory cell and the gate of the transistor of the memory cell by delaying the operation timing of a sense amplifier when the high resistance shortcircuit is to be detected.

The present invention provides a semiconductor storage device including an array of memory cells constituted by a capacitor storing an electric charge 10 and a transistor, a sense amplifier section constituted by at least one sense amplifier for distinguishing, as data, the electric charge stored in each of the memory cells, and a sense amplifier control section for controlling operation of the sense amplifier section in which the sense amplifier is delayed by a predetermined time as compared with a normal mode and is operated in a test mode.

According to the present invention, the timing in which the sense amplifier is activated is delayed by a predetermined time in the test mode. Consequently, it is possible to detect a high resistance shortcircuit generated between a storage node in the memory cell and the gate of the transistor. Thus, the detection test of the high resistance shortcircuit is carried out in a wafer test stage so that defective cell can be detected, and furthermore, the defective cell can be replaced with a redundant cell, thereby enhancing the yield of a good product.

According to a preferred embodiment, the sense amplifier control section may include a delay circuit which is preset to a predetermined delay time, and may serve to output, through the delay circuit only in the test mode, a sense amplifier activating signal generated in response to an externally input ROW address strobe signal for activating the sense amplifier. Consequently, it is possible to easily delay the operation timing of the sense amplifier by a predetermined time in the test mode.

Moreover, it is desirable that the predetermined delay time should be at least a time required for changing an electric potential level of a storage node in a memory cell by a resistor when the storage node and a gate of a transistor are connected through the resistor. The operation timing of the sense amplifier in the test mode is delayed by at least a time required for a change in the electric potential level of the storage node caused by the resistor as described above. Consequently, the high resistance shortcircuit generated between the storage node in the memory cell and the gate of the transistor can be detected more reliably.

According to another embodiment, it is desirable that a semiconductor storage device includes an array of memory cells constituted by a capacitor storing an electric charge and a transistor, a sense amplifier section constituted by at least one sense amplifier for distinguishing, as data, the electric charge stored in each of the memory cells, and a sense amplifier control section for controlling operation of the sense amplifier section in which the sense amplifier is delayed and operated in response to an externally input predetermined signal in a test mode.

If the timing for activating the sense amplifier is delayed in response to the externally input predetermined signal in the test mode, the operation timing of the sense amplifier can be varied unlimitedly in response to the externally input signal. Accordingly, it is possible to detect the high resistance shortcircuit generated between the storage node in the memory cell and the gate of the transistor according to various states.

Moreover, it is desirable that the sense amplifier control section can output, in response to the externally input predetermined signal only in the test mode, a sense amplifier activating signal generated in response to an externally input ROW address strobe signal for activating the sense amplifier of the sense amplifier section. More specifically, the sense amplifier activating signal so generated is output in response to the externally input predetermined signal only in the test mode. Consequently, it is possible to easily delay the operation timing of the sense amplifier by a desirable time in the test mode.

It is desirable that a write-enable signal should be used for the externally input predetermined signal. Consequently, the operation timing of the sense amplifier can easily be controlled externally by using the write-enable signal which is not used for the operation of a ROW system.

BRIEF DESCRIPTION OF THE DRAWINGS

The present invention will become readily understood from the following description of preferred embodiments thereof made with reference to the accompanying drawings, in which like parts are designated by like reference numeral and in which:

FIGS. 6A to 6H are timing charts showing the waveform of each portion in the sense amplifier illustrated in FIG. 3, wherein FIG. 6A shows a sense amplifier activating signal SON in a normal mode, FIG. 6B shows a sense amplifier activating signal ZSOP in the normal mode, FIG. 6C shows a word line WL, FIG. 6D shows the sense amplifier activating signal SON in a test mode, FIG. 6E shows the sense amplifier activating signal ZSOP in the test mode, FIG. 6F shows a pair of bit lines BL and ZBL without a high resistance shortcircuit in the test mode, FIG. 6G shows the bit lines BL and ZBL with the high resistance shortcircuit in the test mode, and FIG. 6H shows the waveform of each of the bit lines BL and ZBL with the high resistance shortcircuit according to a conventional example;

DESCRIPTION OF THE EMBODIMENTS

First Embodiment

Figure 1:
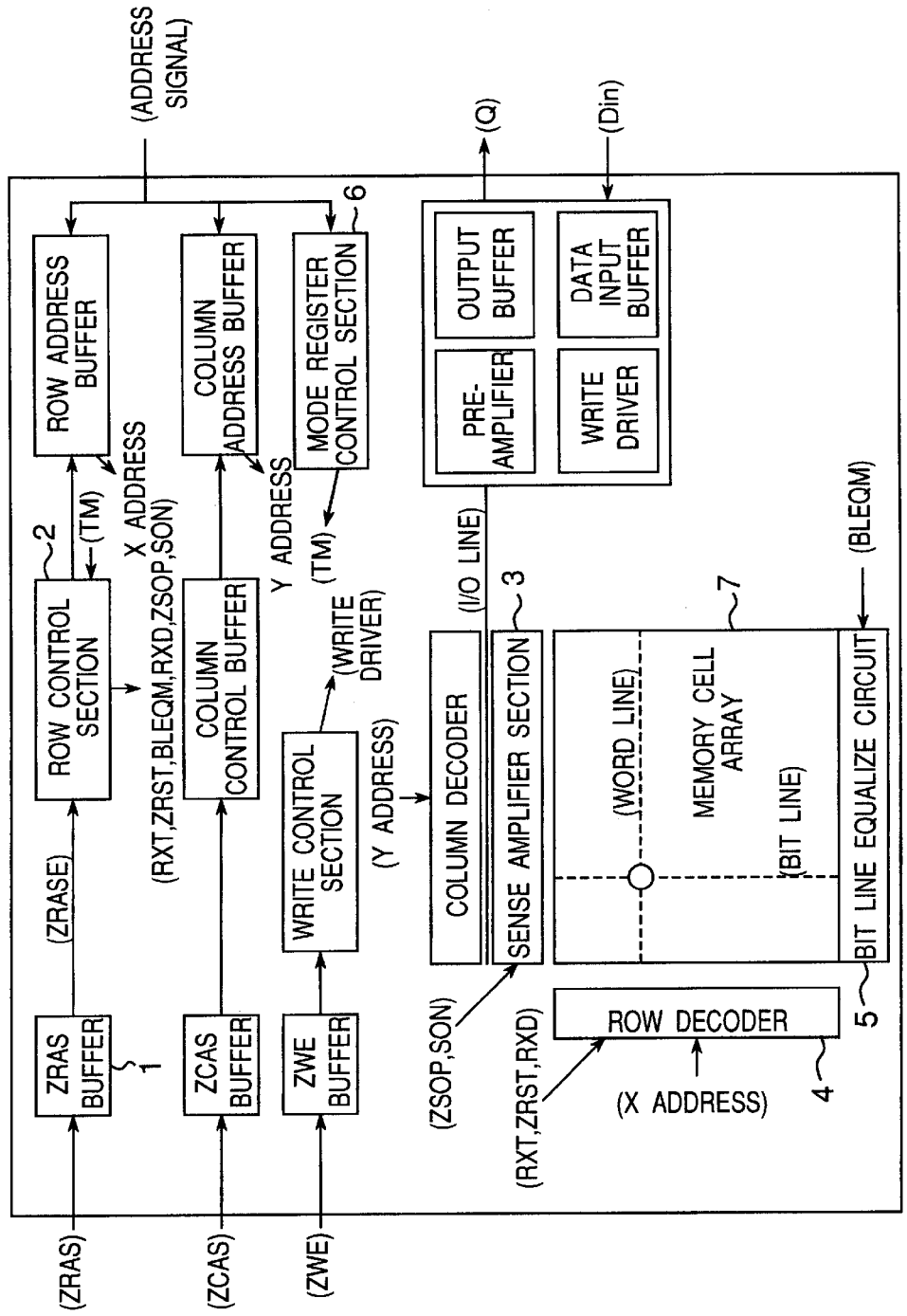
FIG. 1 is a schematic block diagram showing a semiconductor storage device constituted by a DRAM.

FIG. 1 is a schematic block diagram showing an example of a semiconductor storage device constituted by a DRAM. With reference to FIG. 1, description will be given to the operation of a ROW system related to the present invention, in particular, the activating signal of a sense amplifier, and the description of other operations will be omitted.

In FIG. 1, a ZRAS buffer 1 generates an internal RAS signal ZRASE from an externally input ROW address strobe signal (hereinafter referred to as an external RAS signal) ZRAS, and outputs the internal RAS signal ZRASE to a ROW control section 2.

The ROW control section 2 generates, from the input internal RAS signal ZRASE, a word line selection trigger signal RXT to be a trigger signal for selecting a word line, a reset signal ZRST, a bit line equalize signal BLEQM, a word line selection signal RXD, sense amplifier activating signals SON and ZSOP for activating each of the sense amplifiers of a sense amplifier section 3, and the like. The ROW control section 2 outputs the generated word line selection trigger signal RXT, reset signal ZRST and word line selection signal XD to a ROW decoder 4, the generated bit line equalize signal BLEQM to a bit line equalize circuit 5, and the generated sense amplifier activating signals SON and ZSOP to the sense amplifier section 3, respectively.

Moreover, a mode register control section 6 recognizes an externally input address signal as a mode register set and generates a test mode signal TM. In the test mode of the ROW system, for example, the test mode signal TM is output to the ROW control section 2. When inputting the test mode signal TM, the ROW control section 2 generates the sense amplifier activating signals SON and ZSOP with a delay and outputs them to the sense amplifier section 3, respectively.

Figure 2:
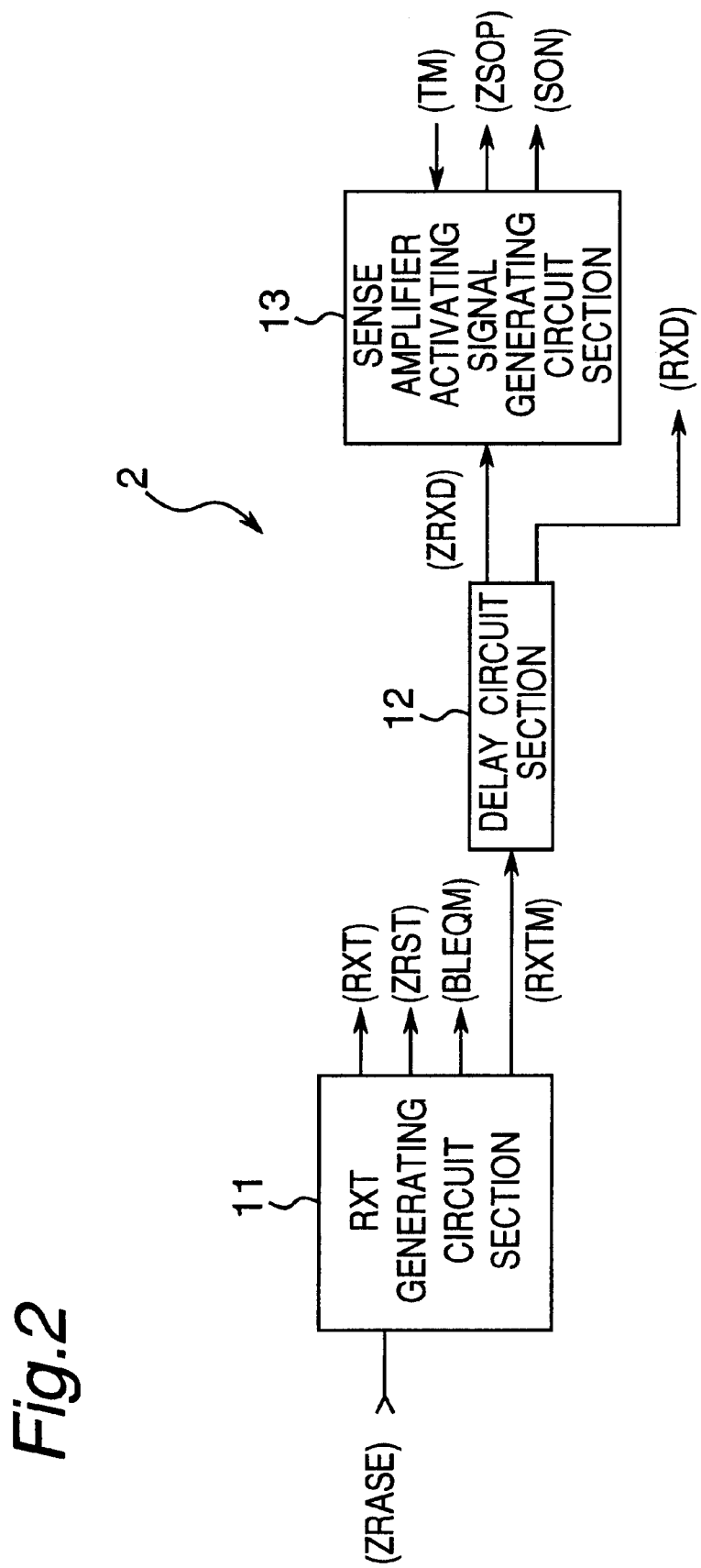
FIG. 2 is a schematic block diagram showing the structure of a ROW control section 2 in FIG. 1.

FIG. 2 is a schematic block diagram showing an example of the structure of the ROW control section 2. In FIG. 2, the ROW control section 2 is constituted by an RXT generating circuit section 11 for generating the word line selection trigger signal RXT, a delay circuit section 12, and a sense amplifier activating signal generating circuit section 13 for generating the sense amplifier activating signals SON and ZSOP. The RXT generating circuit section 11 generates and outputs a word line selection trigger signal RXT, a reset signal ZRST, a bit line equalize signal BLEQM, and a signal RXTM for generating sense amplifier activating signals SON and ZSOP from the input internal RAS signal ZRASE.

The delay circuit section 12 delays the input signal RXTM and generates a word line selection signal RXD, and generates and outputs a signal ZRXD which is an inverted signal of the word line selection signal RXD. The sense amplifier activating signal generating circuit section 13 generates sense amplifier activating signals SON and ZSOP from the input signal ZRXD in response to the test mode signal TM input from the mode register control section 6 and outputs them to the sense amplifier section 3, respectively.

Figure 3:
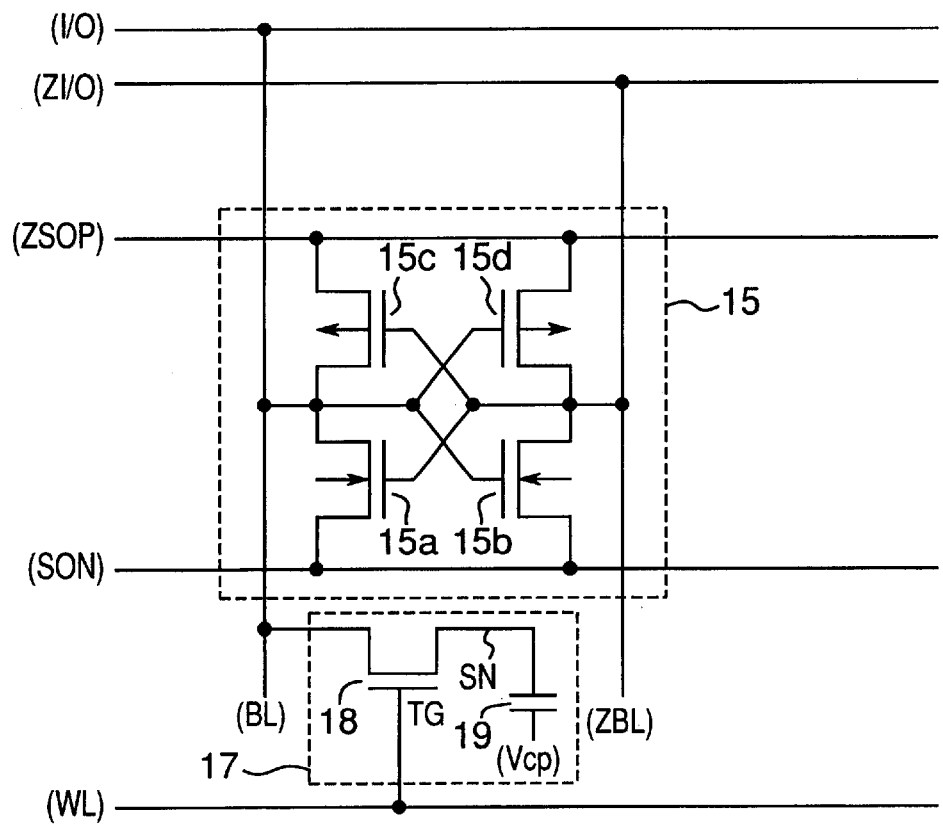
FIG. 3 is a diagram showing a circuit including a sense amplifier of a sense amplifier section 3 and a memory cell of a memory cell array 7 in FIG. 1.

FIG. 3 is a diagram showing an example of a circuit including one of sense amplifiers of the sense amplifier section 3 and one of memory cells of a memory cell array 7 corresponding to the sense amplifier. In FIG. 3, the sense amplifier activating signal SON is output to each of sources of N channel MOS transistors (hereinafter referred to as NMOS transistors) 15a and 15b constituting the sense amplifier 15, and the sense amplifier activating signal ZSOP is output to each of sources of P channel MOS transistors (hereinafter referred to as PMOS transistors) 15c and 15d constituting the sense amplifier 15.

A memory cell 17 is connected to a bit line BL connected to the sense amplifier 15. The memory cell 17 is constituted by an NMOS transistor 18 and a capacity 19. A gate TG of the NMOS transistor 18 is connected to a word line WL and a cell plate voltage Vcp is applied to the capacity 19.

Figure 4:
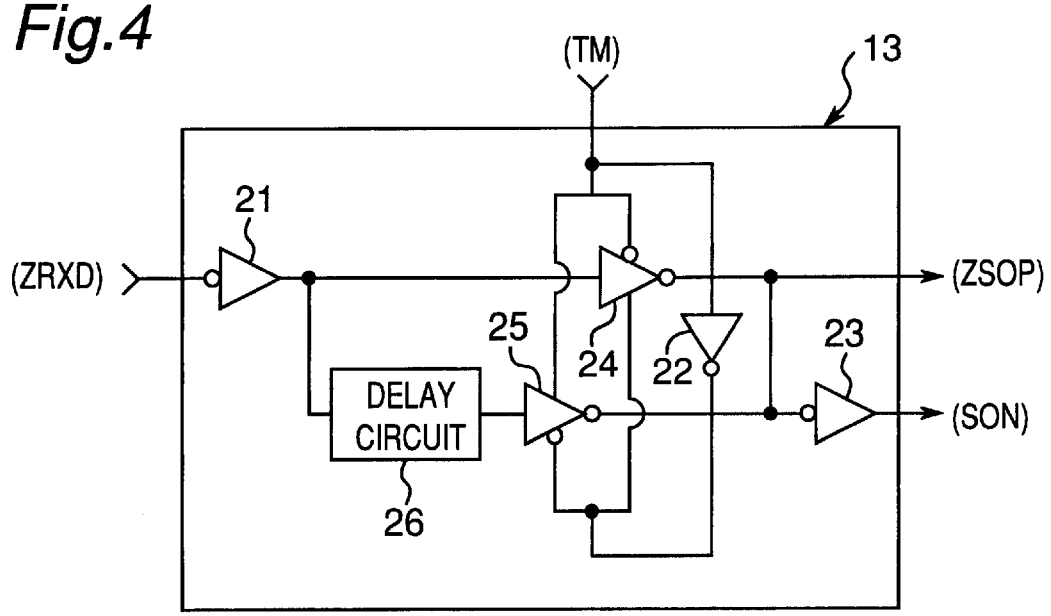
FIG. 4 is a diagram showing a sense amplifier activating signal generating circuit section 13 in FIG. 2.

FIG. 4 is a diagram showing an example of the circuit of the sense amplifier activating signal generating circuit section 13. The sense amplifier activating signal generating circuit section 13 is constituted by inverters 21 to 23, clocked inverters 24 and 25, and a delay circuit 26. A signal ZRXD output from the delay circuit section 12 is input to the inverter input terminal of the clocked inverter 24 and the delay circuit 26 through the inverter 21, and is delayed by the delay circuit 26 and is input to the inverter input terminal of the clocked inverter 25.

A Low-level test mode signal TM is normally input to the sense amplifier activating signal generating circuit section 13, and a High-level test mode signal TM is input to the sense amplifier activating signal generating circuit section 13 in a test mode. Consequently, the clocked inverters 24 and 25 are connected such that only the clocked inverter 24 is normally turned ON and only the clocked inverter 25 is turned ON in the test mode, and the test mode signal TM is input to one of gate control signal input terminals and the inverted signal of the test mode signal TM is input to the other gate control signal input terminal through the inverter 22.

The output terminals of the clocked inverters 24 and 25 are connected to each other, and the sense amplifier activating signal ZSOP is output from the connecting portion to the sense amplifier section 3, and the sense amplifier activating signal SON is output from the connecting portion to the sense amplifier section 3 through the inverter 23. Thus, the sense amplifier activating signal generating circuit section 13 normally inputs the Low-level test mode signal TM. Therefore, the input signal ZRXD is output as the sense amplifier activating signal ZSOP through the inverter 21 and the clocked inverter 24, and is further output as the sense amplifier activating signal SON through the inverter 23.

On the other hand, the High-level test mode signal TM is input in the test mode. Therefore, after the signal ZRXD is delayed by a predetermined time T1 through the delay circuit 26, it is output as the sense amplifier activating signal ZSOP through the clocked inverter 25 and is further output as the sense amplifier activating signal SON through the inverter 23.

Figure 5:
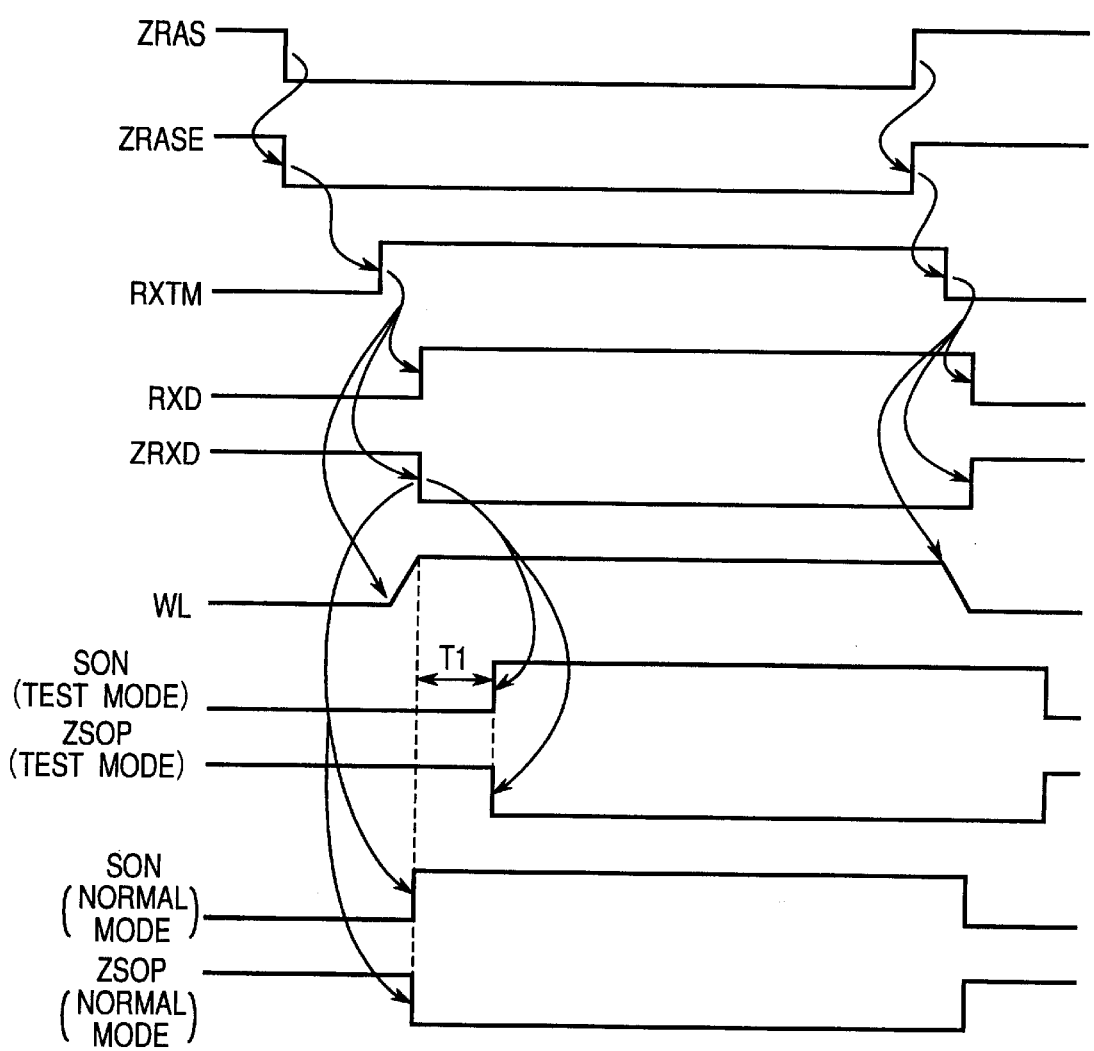
FIG. 5 is a timing chart showing a ROW system signal in each portion illustrated in FIGS. 1 to 4.

With such a structure, FIG. 5 is a timing chart showing a ROW system signal in each portion illustrated in FIGS. 1 to 4. It is apparent from FIG. 5 that the sense amplifier activating signals SON and ZSOP in the test mode are delayed by the predetermined time T1 as compared with a normal mode. Consequently, each of the sense amplifiers of the sense amplifier section 3 starts the operation with a delay of the predetermined time T1 in the test mode as compared with the normal operation.

Figure 6:
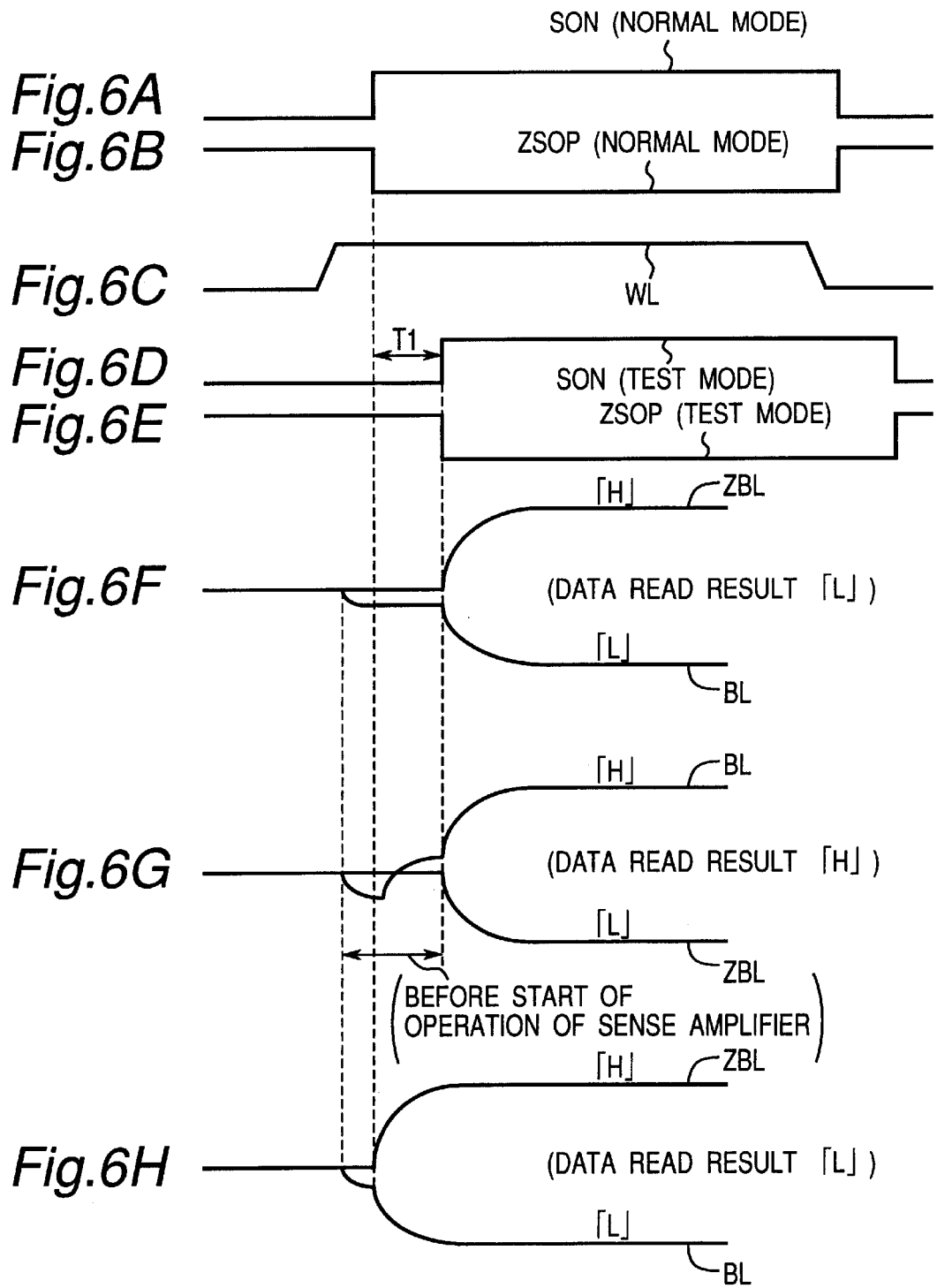

FIG. 6 is a timing chart showing the waveform of each portion in the sense amplifier illustrated in FIG. 3. FIG. 6A shows the waveform of a sense amplifier activating signal SON in a normal mode, FIG. 6B shows the waveform of a sense amplifier activating signal ZSOP in the normal mode, FIG. 6C shows the waveform of a word line WL, FIG. 6D shows the waveform of the sense amplifier activating signal SON in a test mode, FIG. 6E shows the waveform of the sense amplifier activating signal ZSOP in the test mode, FIG. 6F shows the waveform of a pair of bit lines BL and ZBL without a high resistance shortcircuit in the test mode, FIG. 6G shows the waveform of the bit lines BL and ZBL with the high resistance shortcircuit in the test mode, and FIG. 6H shows the waveform of the bit lines BL and ZBL with the high resistance shortcircuit according to a conventional example. FIGS. 6F to 6G shows, as an example, the case in which the data read result normally has the Low-level.

In the test mode, the rise timing of the sense amplifier activating signal SON and the fall timing of the sense amplifier activating signal ZSOP are delayed by a predetermined value T1 as compared with the normal timing. Consequently, the electric potential level of the bit line BL is inverted through the high resistance shortcircuit and the read result has the High-level. Consequently, errors can be made and the high resistance shortcircuit can be detected.

Figure 7:
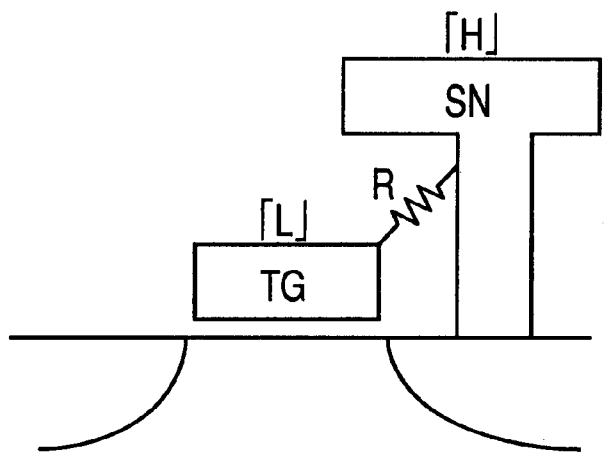
FIG. 7 is a schematic view showing a memory cell with the high resistance shortcircuit.

Description will be given to a method of calculating the delay time T1 set by the delay circuit 26. FIG. 7 is a schematic diagram showing a memory cell with the high resistance shortcircuit. As shown in FIG. 7, it can be supposed that the gate TG of the transistor of the memory cell is connected to the storage node SN with a high resistance R due to an etching residue, a foreign substance or the like during the high resistance shortcircuit. Description will be given to the case in which the resistance R is too high to be detected in a conventional test when the gate TG has the Low-level during stand-by or the like and the electric potential of the storage node SN has the High-level.

Before the High-level electric potential is written to the storage node SN and data are then refreshed and restored, the Low-level electric potential at the gate TG is transmitted to the storage node SN so that data errors are made. Preferably, the Low-level electric potential at the gate TG can be transmitted to the storage node SN, thereby detecting defects to make data errors for a refresh time defined by a spec, for example, 46 ms. Since a high resistance shortcircuit causing no data error in the refresh time does not need to be detected, description thereof will be omitted.

For simplicity of the description, a voltage charged to the High-level electric potential at the storage node Sn is represented as Vcc, and the High-level electric potential at the storage node SN and the threshold of an electric potential which can be recognized by the sense amplifier are represented as Vcc/2. When the electric potential at the storage node SN is changed from Vcc to Vcc/2, an H→L error occurs. The capacity of the storage node SN is represented as C and the electric potential of the storage node SN is represented as a function of time Vc (t). As will be described below, Equation (3) is formed by Equation (1).

$$Vc(t) = -R \cdot I(t) \quad (1)$$

$$Vc(0) = Vcc \quad (2)$$

$$I(t) = C \cdot \{dVc(t)\}/dt \quad (3)$$

By solving the differential equations, the following Equation (4) is obtained.

$$Vc(t) = Vcc \cdot \exp\{-t/(R \cdot C)\} \quad (4)$$

Next, a resistance R having a level which is changed from Vcc to Vcc/2 within 46 ms in which Vc(t) is a refresh spec is calculated. For example, if the storage node SN has a capacity C of 30 pF, a resistance R=3.08×10$^{12}$ (Ω) is obtained. Calculated is the delay time T1 of the sense amplifier operation required for detecting, as a data error, a high resistance shortcircuit having the above-mentioned resistance value in the test mode.

Figure 8:
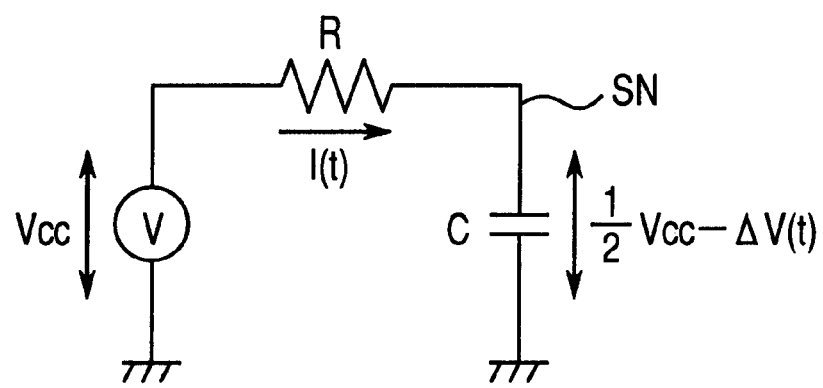
FIG. 8 is a diagram showing an equivalent circuit for the memory cell with the high resistance shortcircuit.

Referring to a model shown in FIG. 8, the following Equations (5) and (6) are formed.

$$Vcc = R \cdot I(t) - Vcc/2 + \Delta V(t) \quad (5)$$

$$I(t) = C \cdot d\{Vcc/2 - \Delta V(t)\}/dt \quad (6)$$

ΔV(t) represents a level at which the bit line is amplified from Vcc/2, which is a precharge level, to the Low-level side when the storage node SN has the Low-level.

For initial conditions, if ΔV(0)=0.2V with t=0, the following Equation (7) is obtained as the differential equation for the Equation (6).

$$\Delta V(t) = (0.2 - 3Vcc/2) \cdot \exp\{t/(RC)\} + 3Vcc/2 \quad (7)$$

With ΔV(t)=0, the sense amplifier recognizes the electric potential of the storage node SN to have the High-level and L→H errors are obtained. In the above-mentioned Equation (7), therefore, it is preferable that a time t for which ΔV(t)=0 is established should be set to the delay time T1 of the operation of the sense amplifier.

Figure 9:
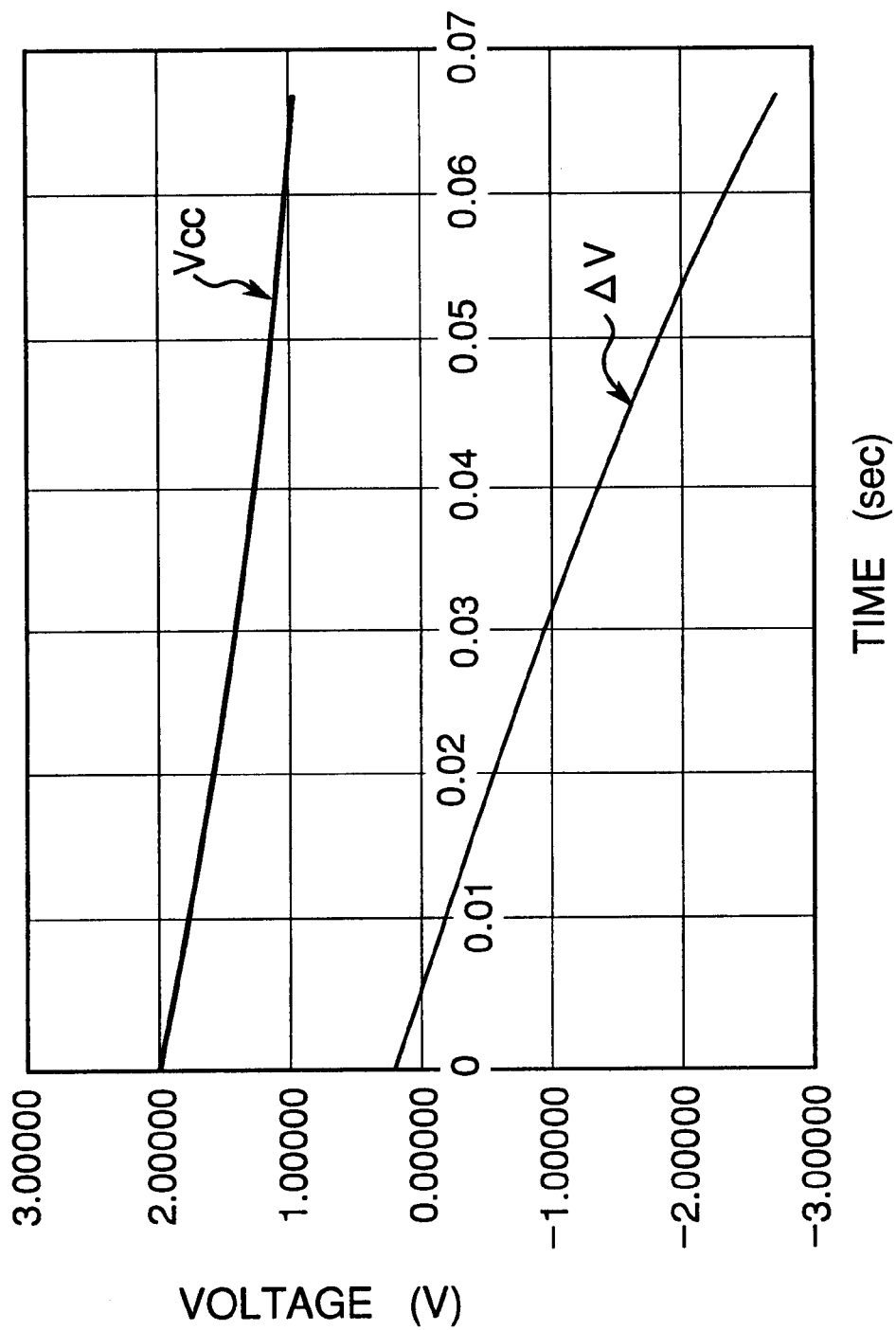
FIG. 9 is a chart showing an example of a change in the electric potential of a storage node SN.

When the calculated R and C values are substituted for the above-mentioned Equation (7), for example, Vcc=2.0 V is set, a change in the electric potential of the storage node SN shown in FIG. 9 is obtained. In FIG. 9, ΔV=0 is obtained in the vicinity of 5 ms. Consequently, it is preferable that the operation delay time T1 of the sense amplifier should be set to approximately 5 ms.

Figure 10:
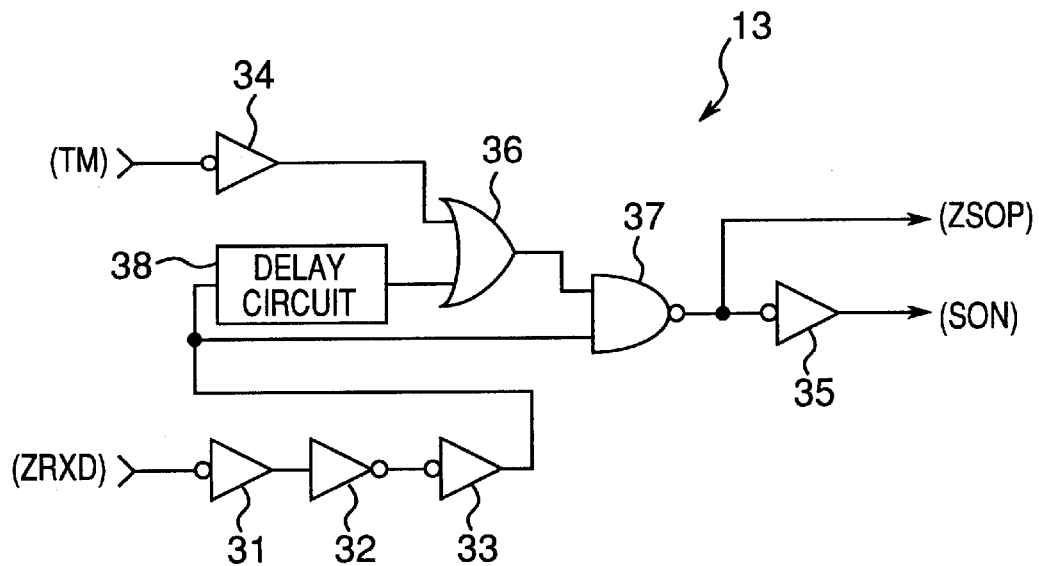
FIG. 10 is a diagram showing a variant of the sense amplifier activating signal generating circuit section in FIG. 2.

A circuit shown in FIG. 10 may be used for the sense amplifier activating signal generating circuit section 13 shown in FIG. 4. In FIG. 10, the sense amplifier activating signal generating circuit section 13 is constituted by inverters 31 to 35, an OR circuit 36, a NAND circuit 37 and a delay circuit 38. The signal ZRXD output from the delay circuit section 12 is input to one of the input terminals of the NAND circuit 37 and the input terminal of the delay circuit 38 through a series circuit in which the inverters 31 to 33 are forward connected in series, and is delayed by the delay circuit 38 and is input to one of the input terminals of the OR circuit 36.

Moreover, the test mode signal TM is input to the other input terminal of the OR circuit 36 through the inverter 34, and the output terminal of the OR circuit 36 is connected to the other input terminal of the NAND circuit 37. The sense amplifier activating signal ZSOP is output from the output terminal of the NAND circuit 37 and the sense amplifier activating signal SON is output through the inverter 35.

With such a structure, the word line selection signal ZRXD normally has the High-level in the normal operation mode in which the test mode signal TM has the Low-level. At this time, the output terminal of the OR circuit 36 has the High-level. Consequently, the output terminal of the NAND circuit 37 has the High-level, the sense amplifier activating signal ZSOP has the High-level and the sense amplifier activating signal SON has the Low-level. Moreover, when the word line selection signal ZRXD has the Low-level, the output terminal of the NAND circuit 37 has the Low-level irrespective of the signal level of the output terminal of the NOR circuit 36. Consequently, the sense amplifier activating signal ZSOP has the Low-level without a delay and the sense amplifier activating signal SON has the High-level without a delay.

On the other hand, when the High-level test mode signal TM is input and the word line selection signal ZRXD falls from the High-level to the Low-level in the test mode, a signal input from the delay circuit 38 to the input terminal of the OR circuit 36 is delayed by a predetermined time T1 through the delay circuit 38 and rises from the Low-level to the High-level. Thus, after the output terminal of the OR circuit 36 has the Low-level for the delay time T1, it rises to have the High-level.

Consequently, the output terminal of the NAND circuit 37 rises from the Low-level to the High-level after the delay time T1, that is, the sense amplifier activating signal ZSOP rises from the Low-level to the High-level after the delay time T1 and the sense amplifier activating signal SON rises from the High-level to the Low-level. Thus, a circuit shown in FIG. 10 can carry out the same operation as that of the circuit of the sense amplifier activating signal generating circuit section 13 shown in FIG. 4.

As described above, the semiconductor storage device according to the first embodiment can detect a high resistance shortcircuit generated between the storage node SN in the memory cell and the gate TG of the transistor by delaying, by a predetermined time, the timing in which each of the sense amplifiers in the sense amplifier section 3 is activated in the test mode. Consequently, the detection test of the high resistance shortcircuit is carried out in a wafer test stage so that defective cell can be detected, and furthermore, the defective cell can be replaced with a redundant cell, thereby enhancing the yield of a good product.

Second Embodiment

While the operation delay time of the sense amplifier in the test mode has a preset value in the first embodiment, the timing of the operation of the sense amplifier may be controlled in response to an externally input signal. In this respect, a second embodiment of the present invention will be described below in detail with reference to FIG. 11.

Figure 11:
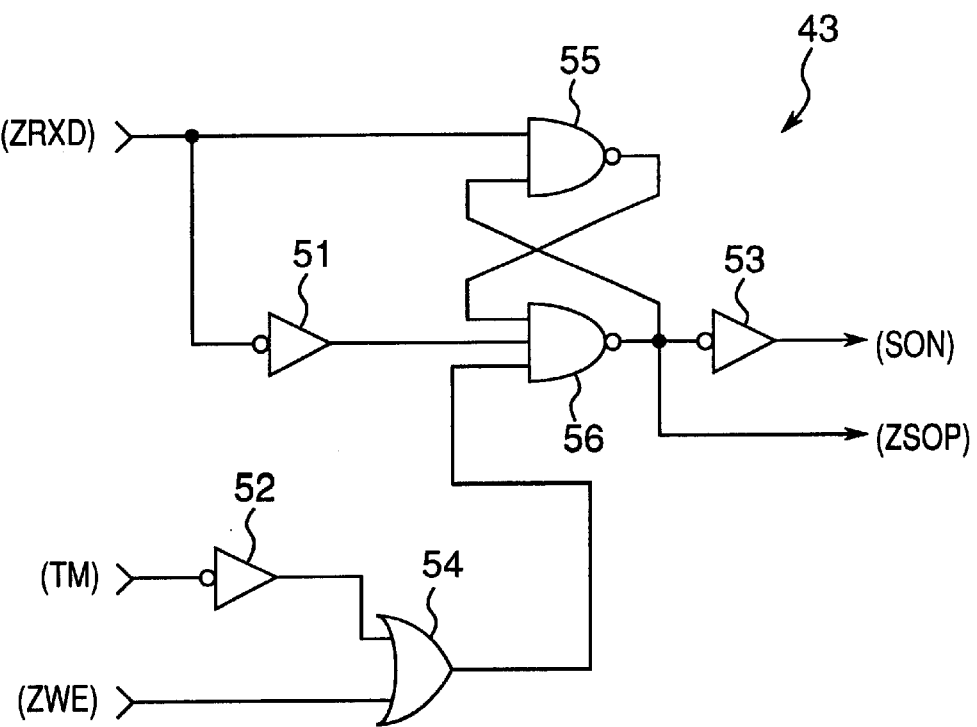
FIG. 11 is a diagram showing a sense amplifier activating signal generating circuit section of a semiconductor storage device according to a second embodiment of the present invention.
Figure 12:
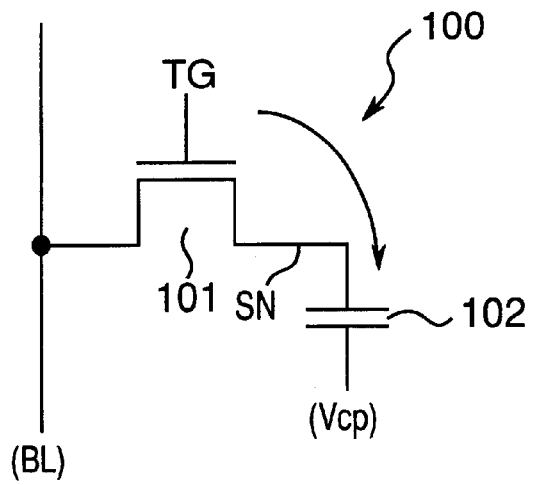
FIG. 12 is a diagram showing a memory cell.
Figure 13:
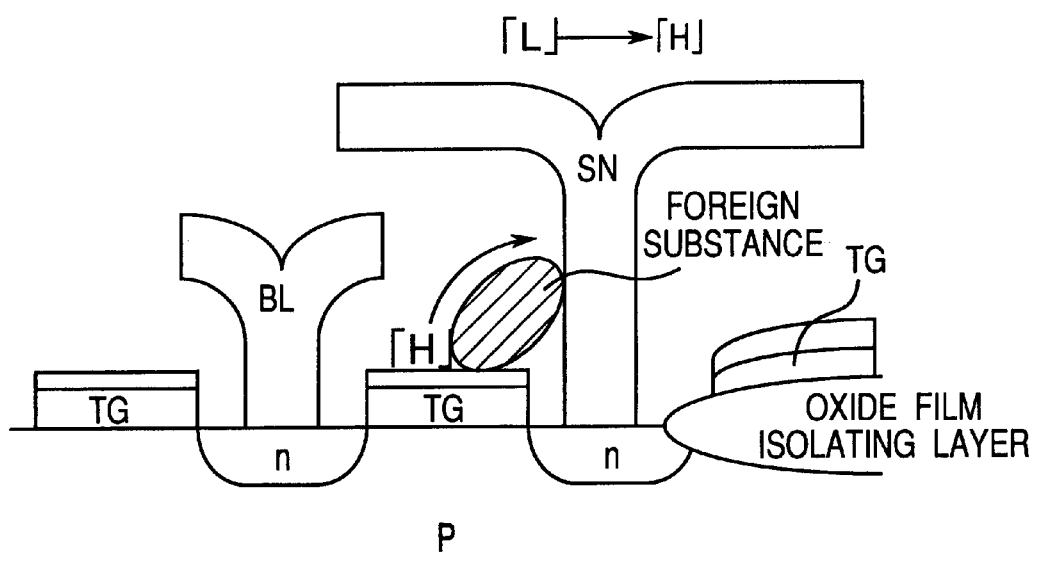
FIG. 13 is a diagram showing the structure of the memory cell with a high resistance shortcircuit.

A sense amplifier activating signal generating circuit section 43 of a semiconductor storage device shown in FIG. 11 controls the rise of a generated sense amplifier activating signal SON and the fall of a sense amplifier activating signal ZSOP in response to an externally input write-enable signal ZWE in a test mode.

A schematic block diagram showing the semiconductor storage device according to the second embodiment of the present invention is the same as FIG. 1 except that the write-enable signal ZWE is externally input to a ROW control section, and a schematic block diagram showing an example of the structure of the ROW control section is the same as FIG. 2 except that the write-enable signal ZWE is externally input to the sense amplifier activating signal generating circuit section, which will be therefore omitted, respectively.

The sense amplifier activating signal generating circuit section 43 is constituted by inverters 51 to 53, an OR circuit 54 and NAND circuits 55 and 56. The NAND circuits 55 and 56 form an RS flip-flop, and a signal ZRXD output from a delay circuit section 12 is input to one of the input terminals of the NAND circuit 55 forming one of the input terminals of the RS flip-flop and one of the input terminals of the NAND circuit 56 forming the other input terminal of the RS flip-flop through the inverter 51. A sense amplifier activating signal ZSOP is output from the output terminal of the NAND circuit 56, and furthermore, a sense amplifier activating signal SON is output through the inverter 53.

On the other hand, the NAND circuit 56 is a 3-input NAND circuit, and has the other input terminal to which the output terminal of the OR circuit 54 is connected. A test mode signal TM is input to one of the input terminals of the OR circuit 54 through the inverter 52, and a write-enable signal ZWE is externally input to the other input terminal.

With such a structure, in the normal mode in which the test mode signal TM has the Low-level, the output of the OR circuit 54 has the High-level irrespective of the write-enable signal ZWE. Consequently, the sense amplifier activating signals SON and ZSOP are generated and output in response to a signal ZRXD irrespective of the write-enable signal ZWE. On the other hand, in the test mode, the test mode signal TM has the High-level and the output of the OR circuit 54 is changed in response to the write-enable signal ZWE. For this reason, when both the signal ZRXD and the write-enable signal ZWE have the Low-level, the sense amplifier activating signal SON has the Low-level and the sense amplifier activating signal ZSOP has the High-level. Consequently, the sense amplifier is not operated.

When the signal ZRXD has the Low-level and the write-enable signal ZWE has the High-level, the sense amplifier activating signal SON has the High-level and the sense amplifier activating signal ZSOP has the Low-level. Consequently, the sense amplifier is operated. Moreover, the sense amplifier activating signals SON and ZSOP can be reset by resetting the signal ZRXD with the High-level write-enable signal ZWE. Thus, the sense amplifier activating signals SON and ZSOP can be controlled, that is, the timing of the operation of the sense amplifier can be controlled by using the write-enable signal ZWE which is not utilized for the operation of a ROW system.

As described above, the semiconductor storage device according to the second embodiment has such a structure that the sense amplifier activating signal generating circuit section 43 changes the activating timings of the sense amplifier activating signals SON and ZSOP in response to the externally input write-enable signal ZWE in the test mode in which the test mode signal TM has the High-level and changes the operation timing of each of the sense amplifiers of the sense amplifier section 3. Consequently, the operation timing of the sense amplifier can be controlled in response to the externally input signal and the same effects as those of the first embodiment can be obtained. In addition, the operation timing of the sense amplifier can be varied unlimitedly. Therefore, it is possible to detect a high resistance shortcircuit corresponding to various states.

In the first and second embodiments, Z attached to the head of the designation indicates the inversion of a signal level and Low active.

Although the present invention has been described in connection with the preferred embodiments thereof with reference to the accompanying drawings, it is to be noted that various changes and modifications are apparent to those skilled in the art. Such changes and modifications are to be understood as included within the scope of the present invention as defined by the appended claims, unless they depart therefrom.

What is claimed is:

1. A semiconductor storage device comprising:
    a memory cell array section including a plurality of memory cells constituted by a capacitor storing an electric charge and a transistor;
    a sense amplifier section constituted by at least one sense amplifier for distinguishing, as data, the electric charge stored in each of the memory cells of the memory cell array section; and
    a sense amplifier control section for controlling operation of the sense amplifier section in which the sense amplifier is delayed by a predetermined time as compared with a normal mode and is operated in a test mode.

2. The semiconductor storage device according to claim 1, wherein the sense amplifier control section includes a delay circuit which is preset to a predetermined delay time, and serves to output, through the delay circuit only in the test mode, a sense amplifier activating signal generated in response to an externally input ROW address strobe signal for activating the sense amplifier of the sense amplifier section.

3. The semiconductor storage device according to claim 1, wherein the predetermined delay time is at least a time required for changing an electric potential level of a storage node in a memory cell by a resistor when the storage node and a gate of a transistor are connected through the resistor.

4. The semiconductor storage device according to claim 2, wherein the predetermined delay time is at least a time required for changing an electric potential level of a storage node in a memory cell by a resistor when the storage node and a gate of a transistor are connected through the resistor.

5. A semiconductor storage device comprising:

a memory cell array section including a plurality of memory cells constituted by a capacitor storing an electric charge and a transistor;

a sense amplifier section constituted by at least one sense amplifier for distinguishing, as data, the electric charge stored in each of the memory cells of the memory cell array section; and a sense amplifier control section for controlling operation of the sense amplifier section in which the sense amplifier is delayed and operated in response to an externally input predetermined signal in a test mode.

6. The semiconductor storage device according to claim 5, wherein the sense amplifier control section outputs, in response to the externally input predetermined signal only in the test mode, a sense amplifier activating signal generated in response to an externally input ROW address strobe signal for activating the sense amplifier of the sense amplifier section.

7. The semiconductor storage device according to claim 5, wherein the externally input predetermined signal is a write-enable signal.

8. The semiconductor storage device according to claim 6, wherein the externally input predetermined signal is a write-enable signal.

* * * * *